(12) United States Patent
Schultz et al.

(10) Patent No.: US 7,017,662 B2
(45) Date of Patent: Mar. 28, 2006

(54) HIGH TEMPERATURE ENVIRONMENT TOOL SYSTEM AND METHOD

(75) Inventors: Roger L. Schultz, Aubrey, TX (US); James J. Freeman, Houston, TX (US); Paul F. Rodney, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 10 days.

(21) Appl. No.: 10/992,168

(22) Filed: Nov. 18, 2004

(65) Prior Publication Data

US 2005/0150691 A1 Jul. 14, 2005

Related U.S. Application Data

(60) Provisional application No. 60/520,992, filed on Nov. 18, 2003, provisional application No. 60/520,950, filed on Nov. 18, 2003.

(51) Int. Cl.
*E21B 47/12* (2006.01)

(52) U.S. Cl. ............... 166/254.2; 166/65.1; 166/66; 73/152.03; 73/152.31

(58) Field of Classification Search ............ 166/254.2, 166/65.1, 66, 66.7; 175/40, 45, 46, 48, 50; 73/152.03, 152.31, 152.45
See application file for complete search history.

(56) References Cited

U.S. PATENT DOCUMENTS

| | | | |
|---|---|---|---|
| 4,053,916 A | 10/1977 | Cricchi et al. | |
| 4,391,846 A * | 7/1983 | Raymond | ............... 438/384 |
| 4,724,530 A | 2/1988 | Dingwall | |
| 4,803,178 A | 2/1989 | McCaughan | |
| 4,922,315 A | 5/1990 | Vu | |
| 5,041,975 A | 8/1991 | Minerbo et al. | |
| 5,146,299 A | 9/1992 | Lampe et al. | |
| 5,374,567 A | 12/1994 | Cartagena | |
| 5,416,043 A | 5/1995 | Burgener et al. | |
| 5,541,432 A | 7/1996 | Tsuji | |
| 5,627,092 A | 5/1997 | Alsmeier et al. | |
| 5,670,252 A | 9/1997 | Makowiecki et al. | |
| 5,869,868 A | 2/1999 | Rajeevakumar | |
| 5,991,602 A | 11/1999 | Sturm | |
| 6,145,380 A * | 11/2000 | MacGugan | ............... 73/493 |
| 6,324,904 B1 * | 12/2001 | Ishikawa et al. | ......... 73/152.03 |
| 6,424,011 B1 | 7/2002 | Assaderaghi et al. | |
| 6,443,228 B1 | 9/2002 | Aronstam et al. | |
| 6,472,702 B1 | 10/2002 | Shen | |
| 6,627,954 B1 | 9/2003 | Seefeldt | |
| 6,765,278 B1 * | 7/2004 | Parsons | ............... 257/470 |
| 6,873,916 B1 | 3/2005 | Kolosov et al. | |
| 2001/0055838 A1 | 12/2001 | Walker et al. | |

FOREIGN PATENT DOCUMENTS

WO    WO 03/096073 A1    11/2003

OTHER PUBLICATIONS

International Search Report, Aug. 29, 2005.

* cited by examiner

*Primary Examiner*—Frank S. Tsay
(74) *Attorney, Agent, or Firm*—Conley Rose, P.C.

(57) ABSTRACT

In at least some embodiments, a tool may comprise a tool body and one or more tool components. The tool may further comprise tool electronics located within the tool body, wherein the tool electronics are operable to sense and store tool component characteristics and environmental characteristics. At least some of the tool electronics are operable, at least for one week, when exposed to temperatures of at least 200 Celsius. The tool electronics may be integrated circuits formed on a silicon carbide substrate or a silicon on sapphire substrate. One illustrative embodiment of the tool is a drill bit for employment in a high temperature drill well.

47 Claims, 9 Drawing Sheets

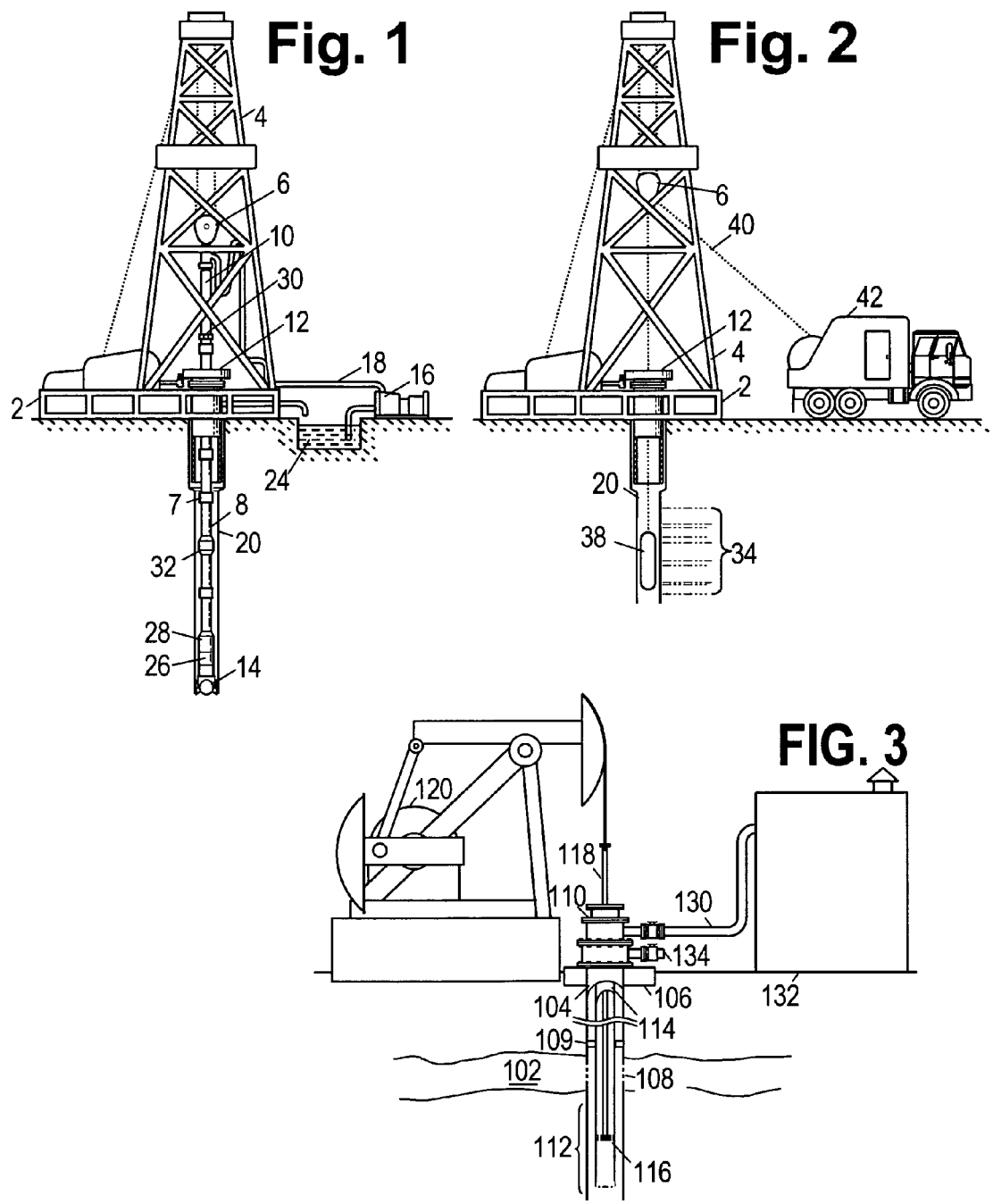

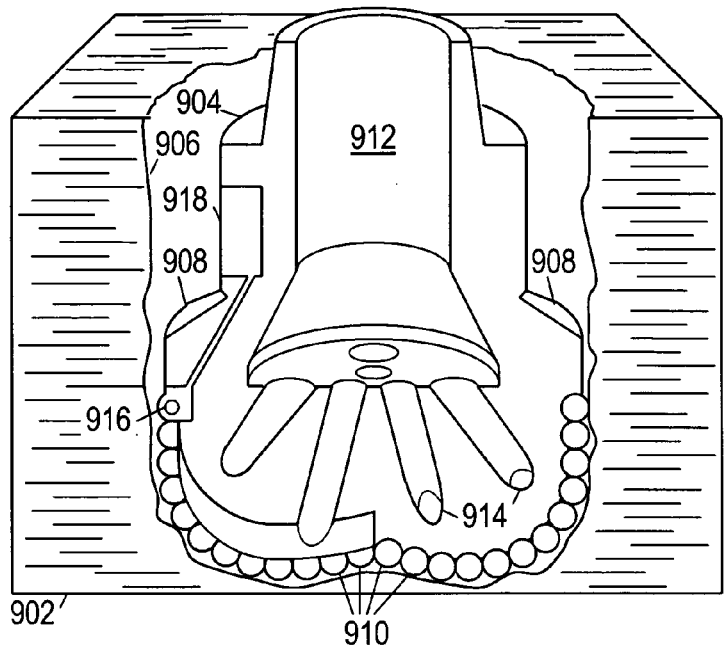
FIG. 9
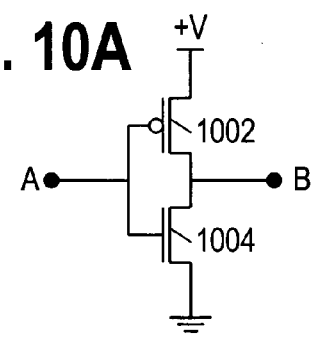
FIG. 10A
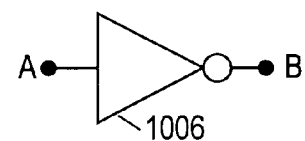
FIG. 10B
FIG. 11
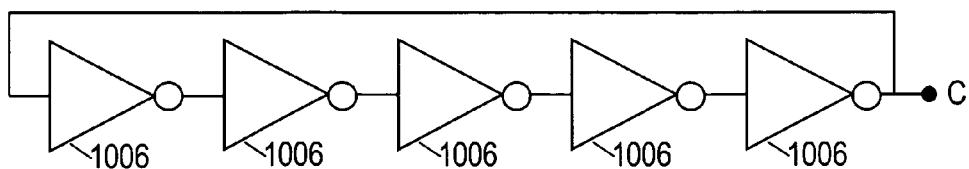

FIG. 15
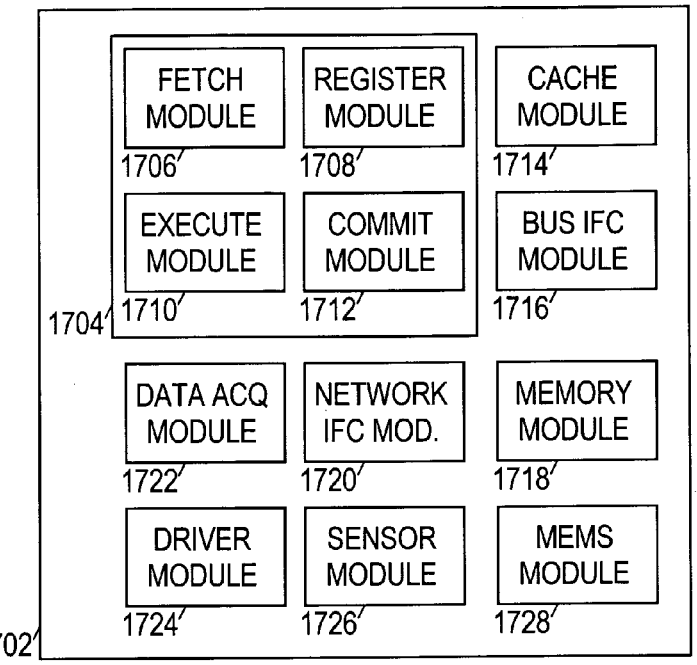
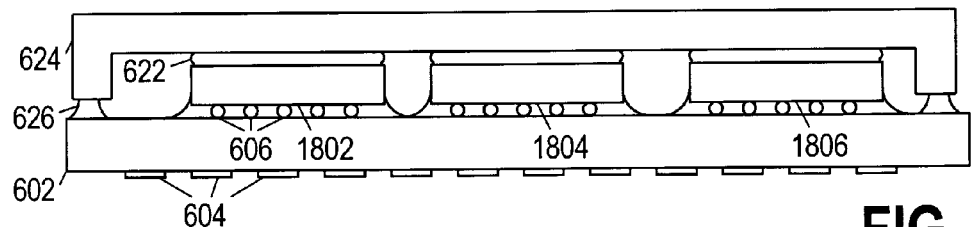
FIG. 16
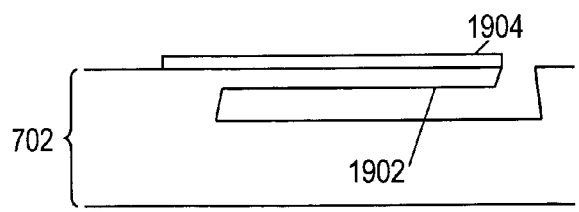
FIG. 17A
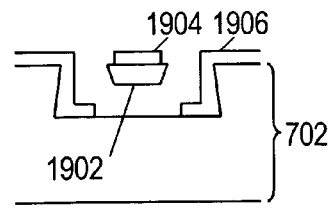
FIG. 17B

HIGH TEMPERATURE ENVIRONMENT TOOL SYSTEM AND METHOD

CROSS-REFERENCE TO RELATED APPLICATIONS

This application is a non-provisional application claiming priority to provisional application Ser. No. 60/520,992, filed on Nov. 18, 2003, entitled "High Temperature Electronics Suitable For Downhole Use," and provisional application Ser. No. 60/520,950, filed on Nov. 18, 2003, entitled "High Temperature SIC Electronics Suitable For Downhole Use, High Temperature SIC Circuits, And Receiver SIC Electronics Proximate Antenna," both of which are hereby incorporated by reference.

STATEMENT REGARDING FEDERALLY SPONSORED RESEARCH OR DEVELOPMENT

Not applicable.

BACKGROUND

Modern petroleum drilling and production operations demand a great quantity of information, relating to parameters and conditions downhole. Such information typically includes characteristics of the earth formations traversed by the borehole, along with data relating to the size and configuration of the borehole itself. The collection of information relating to conditions downhole, which commonly is referred to as "logging", can be performed by several methods.

In conventional wireline logging, a probe (or "sonde") containing formation sensors is lowered into the borehole after some or all of the well has been drilled. The formation sensors are used to determine certain characteristics of the formations traversed by the borehole. The upper end of the sonde is attached to a conductive wireline that suspends the sonde in the borehole. Power is transmitted to the instruments in the sonde through the conductive wireline. Conversely, the instruments in the sonde communicate information to the surface using electrical signals transmitted through the wireline.

An alternative method of logging is the collection of data during the drilling process. Collecting and processing data during the drilling process eliminates the necessity of removing the drilling assembly to insert a wireline logging tool. It consequently allows the driller to make accurate modifications or corrections as needed to optimize performance while minimizing down time. "Measurement-while-drilling" (MWD) is the term for measuring conditions downhole concerning the movement and location of the drilling assembly while the drilling continues. "Logging-while-drilling" (LWD) is the term for similar techniques, which concentrate more on the measurement of formation parameters. While distinctions between MWD and LWD may exist, the terms MWD and LWD often are used interchangeably. For the purposes of this disclosure, the term LWD will be used with the understanding that this term encompasses both the collection of formation parameters and the collection of information relating to the movement and position of the drilling assembly.

In LWD systems, sensors typically are located at the lower end of the drill string. More specifically, the downhole sensors are typically positioned in a cylindrical drill collar positioned near the drill bit. While drilling is in progress these sensors continuously or intermittently monitor predetermined drilling parameters and formation data and transmit the information to a surface detector by some form of telemetry. Alternatively, the data can be stored while the sensors are downhole, and recovered at the surface later when the drill string is retrieved.

Once drilling on a well has been completed, the well may be used for production of hydrocarbons. The well bore may be lined with casing to prevent collapse. The casing may be perforated in certain regions to permit hydrocarbons to enter the well bore from the formation. A string of production tubing may be lowered through the casing to where the hydrocarbons are entering the well bore. Particularly in the situation where the casing is perforated at multiple levels, instruments may be attached to the production tubing to determine the location, type and amount of hydrocarbons that enter the well bore. The instruments may additionally be configured to perform control operations to limit or enhance flows in selected regions of the well bore.

In addition, or alternatively, completed wells may be used for seismic data gathering and long term reservoir monitoring. Typically, an array of sensors is disposed along the length of a well and fixed in place. A telemetry system gathers the sensor data into a central (surface) facility where the data may be processed to extract desired information.

As drilling technology improves, deeper wells are drilled. Pressures and temperatures become significantly higher at greater well depths. At temperatures approaching 200 Celsius, the performance of existing electronic technologies degrades or fails. It would be desirable to create data acquisition systems that are suitable for use at temperatures approaching and well in excess of 200 C.

SUMMARY

In at least some embodiments, a tool may comprise a tool body and one or more tool components attached to the tool body. Illustrative embodiments include drill bits, drill collars, sondes, MWD/LWD tools, and wireline logging tools. The tool may further comprise tool electronics located within the tool body, wherein the tool electronics are operable to sense and store tool component characteristics and/or environmental characteristics. At least some of the tool electronics are operable when exposed to temperatures of at least 200 Celsius. The tool electronics may implement integrated circuits formed on a silicon carbide substrate or a silicon on sapphire substrate. The tool electronics may include micro electromechanical systems (MEMS) capable of detecting acceleration, pressure, rotation, vibration and temperature.

BRIEF DESCRIPTION OF THE DRAWINGS

A better understanding of the disclosed embodiments can be obtained when the following detailed description is considered in conjunction with the following drawings, in which:

FIG. 1 shows a representative logging-while-drilling (LWD) configuration;

FIG. 2 shows a representative wireline-logging configuration;

FIG. 3 shows an illustrative well during production operations;

FIG. 9 shows a cut-away view of a drill bit;

FIGS. 10A and 10B show an electrical schematic of a CMOS inverter;

FIG. 11 shows an illustrative inverter ring oscillator;

FIG. 15 shows a partitioned device;

FIG. 16 shows an illustrative circuit card suitable for use at elevated temperatures;

FIGS. 17A and 17B show an illustrative MEMS device;

Figure 4:
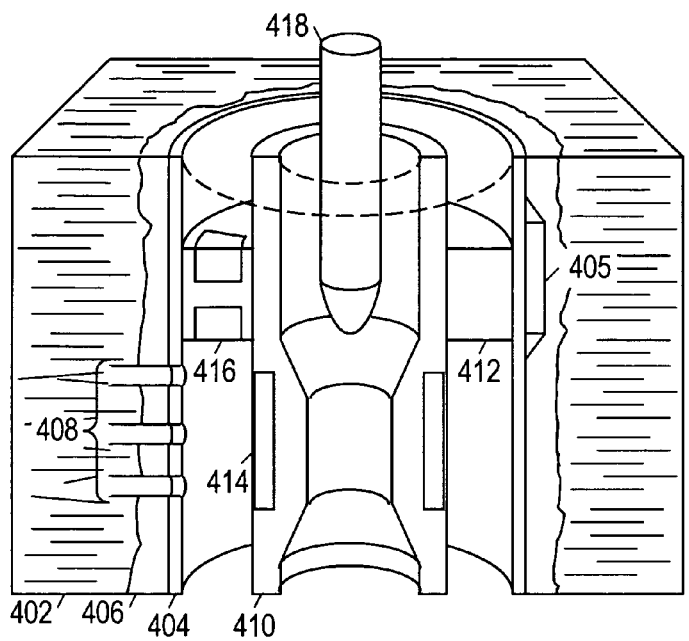
FIG. 4 shows a cut-away view of a production well.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

NOTATION AND NOMENCLATURE

Certain terms are used throughout the following description and claims to refer to particular system components and configurations. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. The terms upstream and downstream refer generally, in the context of this disclosure, to the transmission of information from subsurface equipment to surface equipment, and from surface equipment to subsurface equipment, respectively. Additionally, the terms surface and subsurface are relative terms. The fact that a particular piece of hardware is described as being on the surface does not necessarily mean it must be physically above the surface of the earth; but rather, describes only the relative placement of the surface and subsurface pieces of equipment.

DETAILED DESCRIPTION

Embodiments of the invention preferably provide a system and method that allow data acquisition in high temperature environments. In at least some embodiments, the system may comprise a tool configured to perform a particular function in a high temperature environment. For example, the tool may have a tool body and one or more components that perform a function. For example, the tool may be a drilling tool that is implemented in a drilling well. In order to function as desired, the tool may periodically (or continuously) monitor tool component characteristics and environmental characteristics such as temperature, vibration, pressure, movement and other characteristics. Therefore, embodiments may include electronics capable of sensing the characteristics and converting the characteristics to an electronic signal (within a desired degree of accuracy). Additionally, embodiments may include electronics that store information related to the characteristics. This information may be accessed by the tool and/or a tool operator interface (e.g., a computer) located remotely from the tool. If the information is to be accessed at the tool operator interface, the tool may include a telemetry system that allows the tool operator interface to receive the information without removing the tool from the high temperature environment. The tool operator interface may allow a tool operator to view the characteristics sensed, recorded and transmitted by the tool. The operation of the tool may be adjusted as necessary to allow cost efficient functionality of the tool in the high temperature environment.

Turning now to the figures, FIG. 1 shows a representative well during drilling operations. A drilling platform 2 is equipped with a derrick 4 that supports a hoist 6. Drilling of oil and gas wells is typically carried out with a string of drill pipes connected together by "tool" joints 7 so as to form a drill string 8. The hoist 6 suspends a kelly 10 that is used to lower the drill string 8 through rotary table 12. Connected to the lower end of the drill string 8 is a drill bit 14. The bit 14 is rotated by rotating the drill string 8 or by operating a downhole motor near the drill bit. The rotation of the bit 14 extends the borehole.

Drilling fluid is pumped by recirculation equipment 16 through supply pipe 18, through drilling kelly 10, and down through the drill string 8 at high pressures and volumes to emerge through nozzles or jets in the drill bit 14. The drilling fluid then travels back up the hole via the annulus between the exterior of the drill string 8 and the borehole wall 20, through the blowout preventer (not specifically shown), and into a mud pit 24 on the surface. On the surface, the drilling fluid is cleaned and then recirculated by recirculation equipment 16. The drilling fluid cools the drill bit 14, carries drill cuttings to the surface, and balances the hydrostatic pressure in the rock formations.

Downhole instrument sub 26 may be coupled to a telemetry transmitter 28 that communicates with the surface to provide telemetry signals and receive command signals. A surface transceiver 30 may be coupled to the kelly 10 to receive transmitted telemetry signals and to transmit command signals downhole. Alternatively, the surface transceiver may be coupled to another portion of the rigging or to drillstring 8. One or more repeater modules 32 may be provided along the drill string to receive and retransmit the telemetry and command signals. The repeater modules may include sensors for detecting local conditions such as pressure, temperature, fluid flow, and vibration. The surface transceiver 30 is coupled to a logging facility (not shown) that may gather, store, process, and analyze the telemetry information.

In one embodiment, the telemetry and command signals are transmitted acoustically along the drillstring walls. In an alternative embodiment, the drillstring is made from wired drill pipe that can transport electrical signals via wires embedded in the drillstring walls.

FIG. 2 shows a representative well during wireline logging operations. The derrick 4 is not necessary for wireline logging, but is typically present throughout the drilling process. The drill string has been removed from the borehole to allow a sonde 38 to be lowered by wireline 40 into the well. Typically, the sonde 38 is lowered to the bottom of the region of interest and subsequently pulled upward at a constant speed. During the upward trip, the sonde 38 performs measurements on the formations 34 adjacent to the borehole as the sonde passes by. The measurement data are communicated to a logging facility 42 for storage, processing, and analysis. In another embodiment, the sonde may be attached to the end of a continuous tubing (CT) string and moved through the well bore by the coiled tubing.

During the wireline logging operations, the borehole may be filled with a fluid that balances the pressure in the formation and preserves the integrity of the borehole. A number of fluid types may be used, depending on considerations of cost, environment, and formation type. The fluids may be water-based or oil-based, and are generally formulated with weighting agents to customize the fluid density. Sometimes, however, the only fluid may be air (e.g., in hard-rock country).

The electronics employed in the downhole instrument sub 26 and in the sonde 38 are configured to operate at the elevated temperatures experienced downhole. Because the electronics are resident in the borehole for only a limited time, the electronics may be shielded from the elevated temperatures by insulation, heat-absorbing materials, and/or active refrigeration. These traditional approaches to configuring electronics for elevated temperature operation have been motivated by the poor performance of many electronics when they are directly exposed to environments with temperatures above 185 Celsius. However, these approaches greatly increase the size of the electronics package, and in the case of active refrigeration, greatly increase the energy consumption by the electronics package. Further, these approaches have not suggested a solution for providing electronics that can remain resident in a well indefinitely. A number of electronics solutions and applications are described herein below.

FIG. 3 shows a representative well during production. A well has been drilled through the earth to intersect a fluid reservoir 102. The well is generally lined with casing 104 that extends from the well head 106 to below the fluid reservoir 102. The casing 104 is perforated 108 where it intersects the reservoir to allow fluid to flow into the interior of casing 104. A blow-out preventer 110 is attached to the well head 106 for controlling fluid and gas flows from the well. One or more production tubing strings 114 may be placed within the casing to transport fluids and gasses to the surface. A packer 109 may be provided in the annulus between the production tubing 114 and the casing 104 to isolate different regions within the well. Various valves (not specifically shown) may be provided to regulate the flow into the production tubing from different regions of the well.

Often, the fluid pressure in the formation will be sufficient to force the fluid to the surface via the production tubing 114. On the other hand, artificial lift is often employed when the fluid pressure is insufficient. The well of FIG. 3 is a well configured with a "walking beam" pump for artificial lift. In the embodiment shown, a pump body 112 is affixed to the lower end of a production tubing string 114 and lowered through the blow-out preventer 110 to be submerged in the fluid pooling at the bottom of the well. The production tubing is secured to the well head 106. Also, the pump body 112 is preferably anchored downhole using standard well servicing techniques. A pump plunger 116 is affixed to the bottom of a sucker rod string 118 and lowered through the interior of the production tubing string until it is properly seated in pump body 112. A packing unit (not specifically shown) in blow out preventer 110 seals the gap between the sucker rod string 118 and the blow out preventer 110, but allows for vertical movement of the tubing 114. A surface pump unit 120 reciprocates (cyclically raises and lowers) the sucker rod string 118, thereby reciprocating the plunger 116 in the pump body 112. The reciprocation of the plunger 116 forces fluid upward through the production tubing string 114 to the surface. Surface outflow from the production tubing string 114 is preferably conveyed via a fixed outflow passage 130 to an above-ground storage tank 132.

Production wells may be logged with production logging tools that measure various parameters such as (e.g.) flow rates, temperatures, pressures, fluid properties, gamma radiation properties, etc. Production logging may be accomplished with wireline or slickline tools. The tools may use wireline conductors for telemetry, or the tools may be "memory tools" that accumulate data over an extended period.

Though drilling and production have been specifically described above, other contexts for the use of downhole electronics also exist. For example, fluid injection, formation fracturing, seismic mapping, and long term monitoring are also appropriate contexts for the use of downhole electronics. The various tools that have been developed or proposed for application in these varied contexts have to satisfy different requirements, including among other things, high temperature operability, reliability, extended mission life, size limitations, power limitations, and robustness. Wireline tools typically run between 3 to 30 hours on each trip. Logging while drilling (LWD) tools typically run between 2 days to 2 weeks. Memory tools may be run from a few days to a few months. Permanently installed monitoring systems may operate from 3 years to 10 years or more. In each case, improving the suitability of the electronics for high-temperature operation will lengthen the mission life and extend the time period over which the tools can be reused without servicing. The suitability of the electronics for high-temperature operation will also benefit reliability and robustness, and may further reduce or eliminate space or power demands for refrigeration equipment.

It is desirable to provide electronic instruments and controls that may stay resident in wells indefinitely at elevated temperatures. In production wells, the electronics may sense fluid type, flow rate, pressure, temperature, and other parameters. Electronic controls may be provided to regulate flows from different regions of a formation, or to control artificial lift parameters such as the gas injection rate, fluid heating energy, or pumping rates. In test wells, the electronics may include seismic energy sensors for reservoir mapping and monitoring.

FIG. 4 shows examples of electronics that may be disposed indefinitely in a well. A well in a formation 402 is lined with casing 404. The casing may include an instrument package 405 attached to its exterior. The casing is typically surrounded by cement 406. Perforations 408 in the casing and surrounding cement reach the formation and allow fluids to enter the well bore. A production tubing string placed in the casing may include an instrument sub 410 having an electronics package 414 located in thickened walls of the instrument sub. The annulus between the production tubing and the casing may be sealed by a packer 412 to isolate different portions of the well. The packer may include one or more electronics packages 416. A wireline sonde 418 or other probe may be inserted and possibly anchored indefinitely within the production tubing or even anchored indefinitely in a cased or uncased well bore. Any of various forms of telemetry may be used to communicate with the surface, including but not limited to radio frequency communication, electrical transport over a wireline cable, and acoustic telemetry. Alternatively, data may be stored for later retrieval.

Figure 5:
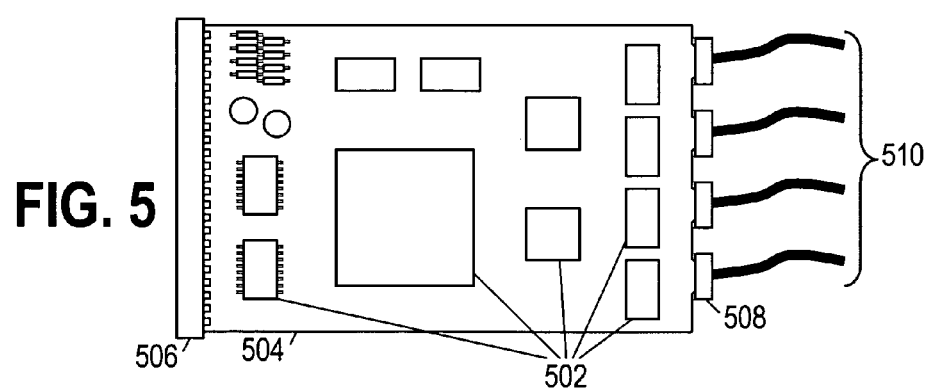
FIG. 5 shows an illustrative circuit card suitable for use at elevated temperatures.

FIG. 5 shows a number of packaged integrated circuit chips 502 mounted on a circuit card 504. The circuit card 504 is shown attached to a connector 506 suitable for connecting the circuit card 504 to a tool bus which may be connected to other circuit cards. Also attached to the circuit card 504 are connectors 508 suitable for connecting the circuit card to sensors and actuators that may be individually controlled by the circuit card. The circuit card 504 provides physical support and electrical interconnections for the packaged chips 502, connectors 506, 508, and other components attached to the card.

Each chip package 502 can take the form of a multi-chip module, i.e., a package having a substrate upon which are mounted multiple integrated circuit die. The substrate provides physical support and electrical interconnections between the multiple die and also between the die and external pins or pads.

Many integrated circuits are subject to performance degradation or failure at moderately elevated temperatures (e.g., 150° C.), while other integrated circuits may continue to perform adequately at such temperatures. In various circuits that may be desirable for long-term installation at moderately elevated temperatures, continuous operation is not necessary. Rather, certain portions of a circuit may need to be accessed only briefly and at infrequent intervals, e.g., nonvolatile program memory may only need to be accessed at power-on and reset events. Voltage references may only be needed at infrequent calibration events. In such circuits, refrigeration efforts may be localized to just that portion of the circuit that requires cooling. Further, the refrigeration may be performed only when the operation of the temperature-sensitive circuits is needed. In such circuits, refrigeration operations may be performed directly on the die or package containing the temperature-sensitive circuitry, greatly reducing the thermal mass that needs to be cooled. Further, since the refrigeration operations may be brief and infrequent, the refrigeration system may be small, and the heat sink may be reduced in size or eliminated. In this manner, the size and power requirements for electronics cooling may be drastically reduced.

Figure 6A:
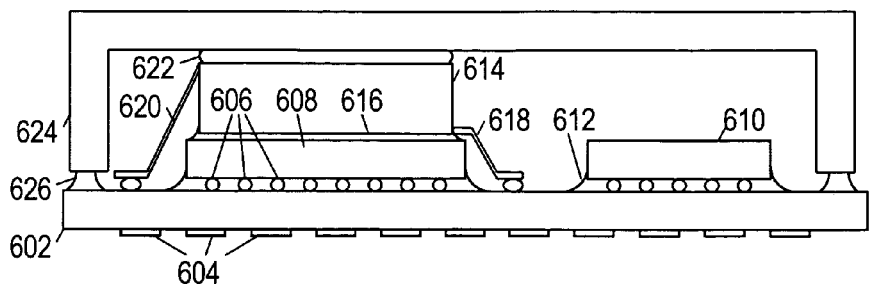
FIGS. 6A and 6B show illustrative embodiments of an electronics package with focused, intermittent cooling.

FIG. 6A shows an illustrative multi-chip module (MCM) having a substrate 602 with pads 604 for external electrical connections. Electrical paths and pads may also be provided for internal connections on the other side of substrate 602. In FIG. 6A, an integrated circuit die 608 is shown in a "flip chip" configuration. In this configuration, solder balls 606 are attached to the active surface of the die 608, and these balls are positioned against mating balls or pads on substrate 602. The solder balls are partially melted, forming physical, electrically conductive connections. Other dies 610 may be similarly mounted. A nonconductive adhesive material 612 may be introduced into the gap between the dies 608, 612 and the substrate 602 to reinforce the physical attachment. Other MCM configurations such as wire bonding may also be used.

In the MCM of FIG. 6A, a Peltier cooler 614 is mounted on the inactive ("back") surface of die 608 with a thermally conductive adhesive 616. A Peltier cooler comprises a multi-layer sandwich of interleaved metal layers. As current flows from layer to layer, heat is transported from one surface of the cooler to the opposite surface. Electrode 618 is attached to the cooled (bottom) surface, and electrode 620 is attached to the heated (top) surface. These electrodes may be bonded to substrate 602.

Depending on the various parameters for cooling the electronics and the performance of the cooler, a dedicated heat sink may be unnecessary. In the MCM of FIG. 6A, a thermally conductive and deformable material 622 thermally couples the top surface of the Peltier cooler 614 to the package cap 624, which serves a dual purpose as packaging and heat sink. An adhesive bond 626 attaches cap 624 to substrate 602 and seals the package. In one embodiment, the substrate 602 comprises a ceramic material with patterned metal layers for interconnects. The cap 624 may be a ceramic, plastic, or metal material.

Figure 6B:
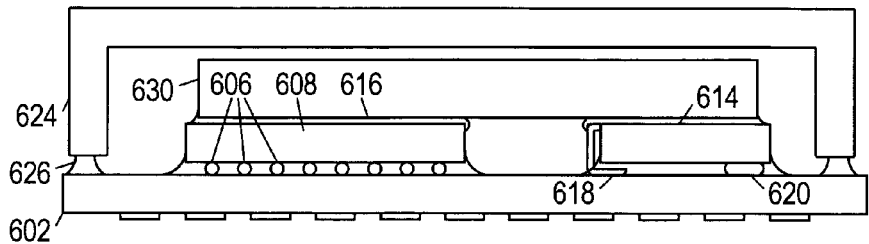

FIG. 6B shows a variant MCM configuration in which the Peltier cooler 614 is mounted directly on substrate 602. The Peltier cooler 614 cools die 608 indirectly via a thermal conductor 630 which is bonded to both the cooler 614 and die 608 with thermally conductive adhesive.

Die 608 may include a Flash memory and a voltage reference. Flash memory can generally retain information at temperatures above the point where the read and write circuitry fails. Upon needing to access the Flash memory to retrieve or store data, a controller may energize the Peltier cooler and pause for a predetermined time interval while the cooler reduces the temperature of the read and write circuitry. Once the interval ends, the controller may perform the needed memory accesses and de-energize the cooler. A volatile memory may be used to buffer data traveling to and from the Flash memory, thereby reducing the frequency of accesses to the nonvolatile memory.

Voltage references can be temperature controlled in a similar fashion. That is, a controller may energize the Peltier cooler to temporarily regulate the temperature of a voltage reference, and pause for a predetermined time interval to allow the voltage reference's temperature to stabilize before performing a calibration operation with a voltage reference. The accuracy of the voltage reference may be increased by limiting the temperature range in which it is employed. The controller can de-energize the cooler when the voltage reference is not in use.

The need for cooling may be reduced or eliminated through the use of a different semiconductor technology. Transistors and other integrated circuit components are formed by placing differently-doped regions of silicon in contact with each other to create depletion regions. As the device temperatures increase, thermally excited electrons create stray current carriers in the depletion regions. The stray current carriers cause a leakage current to flow to or from regions that are supposed to be isolated by these depletion regions. The leakage currents increase rapidly as a function of temperature, and at elevated temperatures, the leakage currents may be quite large. Large leakage currents are detrimental for a number of reasons. The leakage currents give rise to additional heat dissipation, which may further raise the temperature and thereby further increase leakage currents. Leakage currents will substantially increase the integrated circuit's power consumption. Leakage currents generally degrade the performance of integrated circuits, and at some temperature the circuits will be rendered inoperable. Finally, leakage currents increase the likelihood of unintentional and undesirable interaction between integrated circuit components. One example of a common interaction is the "latchup" effect, in which a current path forms between different transistors with a runaway effect that leads to large currents that typically can only be stopped by removing power from the circuit.

Rather than relying on die from silicon wafers, integrated circuits may be formed on silicon carbide wafers. Silicon carbide has a larger energy band gap than silicon, making it much more difficult for thermally excited electrons to create stray current carriers. This relative immunity sharply reduces leakage currents in integrated circuits. When patterned with suitably-designed devices, silicon carbide (SiC) wafers may be suitable for constructing electronics that perform well at elevated temperatures. Accordingly, such devices would be suitable for use in high-temperature (e.g., downhole) environments.

Alternatively, integrated circuits may be formed on electrically insulated wafers. By separating the active device regions from the wafer bulk, the size of the depletion regions is greatly reduced, and the leakage currents are reduced correspondingly. Such insulated wafers may include bulk silicon wafers with an insulating layer between the circuitry and the bulk of the wafer substrate. However, in such insulated configurations, there are additional steps required to form and preserve the insulating layer during fabrication of the integrated circuits. Also, there remains in such configurations a capacitive coupling with the wafer bulk that affects power consumption and limits the integrated circuit's operating speed. For downhole and/or high-temperature applications, it may be preferred to use wafers of a bulk insulating material. For example, sapphire is an insulating material which may be formed into single-crystal wafers and provided with a semiconducting surface layer. Sapphire wafers with a thin silicon surface layer are commercially available. When patterned with suitably-designed devices, silicon-on-sapphire (SOS) wafers may be suitable for constructing electronics that perform well at elevated temperatures. Accordingly, such devices would be suitable for use in high-temperature (e.g., downhole) environments.

Figure 7A:
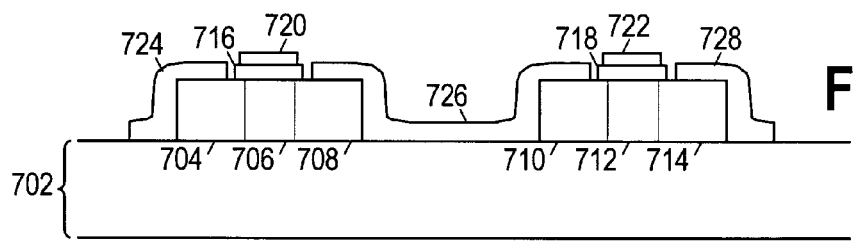
FIGS. 7A and 7B show illustrative physical SOS structures.

FIG. 7A shows an illustrative cross-section of a complementary metal-oxide-semiconductor (CMOS) inverter constructed using a SOS technology. The inverter includes two transistors, each constructed as an isolated island on a sapphire substrate 702. The first transistor includes a p-doped region 706 of silicon between two $n^+$-doped regions 704, 708. The second transistor includes an n-doped region 712 between two $p^+$-doped regions 710, 714. Regions 706 and 712 are the active regions, and are each separated by corresponding insulating oxide layers 716, 718 from corresponding gate electrodes 720, 722. When a positive voltage is applied to gate 720, a channel forms in active region 706, thereby electrically coupling electrode 724 to center electrode 726. A similar voltage applied to gate 722 eliminates the channel in region 712, thereby isolating the center electrode 726 from electrode 728. Conversely, when the positive voltage is removed from gates 720 and 722, the channel in region 706 disappears, while the channel in region 712 is re-established. The center electrode 726 is thus isolated from electrode 724 and coupled to electrode 728. If electrode 724 is coupled to ground, and electrode 728 is coupled to a positive supply voltage, the voltage driven to center electrode 726 is the digital inverse of the voltage on the gate electrodes.

Note that these and other cross-sectional views of integrated circuits are not drawn to scale. Typically, the wafer substrate is about 1 mm thick, while the semiconducting layer may (for example) be $10^{-8}$ to $10^{-4}$ m thick. The thickness of the conducting layers may be around 10–100 nm thick.

By creating the transistors as islands on an insulating substrate, stray leakage paths are eliminated. Such current leakage paths are a primary source of performance degradation or failure at elevated temperatures, and their elimination allows operation at temperatures much higher than would otherwise be possible.

Figure 7B:
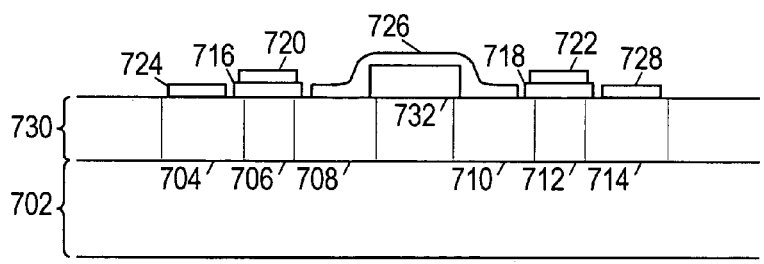

FIG. 7B shows an illustrative cross-section of a CMOS inverter using a different SOS technology. In this approach, a semiconducting layer 730 is present across the surface of the sapphire substrate 702. The transistors are formed in much the same manner as before, but rather than being isolated islands, they are spaced apart within the thin semiconducting layer 730. Conductors interconnecting the transistors (such as center electrode 726) must now be separated from the intermediate regions of the semiconducting layer by thick insulating layers 732 to avoid creating undesired channels and current leakage paths. Nevertheless, the performance of devices in this SOS technology is still significantly improved relative to devices on bulk silicon due to the elimination of leakage paths in the substrate. In addition, the performance may be further enhanced through the use of trenches, guard rings, and other structures to reduce or eliminate leakage through the semiconducting layer 730. (Guard rings are conductive structures around sensitive areas. The structures are held at or near the same potential as the sensitive areas to reduce the electric field gradient, thereby reducing leakage currents).

Electronics that operate at elevated temperatures may be designed to counter environmental effects (besides leakage current) caused by the elevated temperature. For example, electronics packages disposed indefinitely in an elevated temperature environment may be expected to encounter "outgassing" effects. Outgassing is an emission of chemical vapors from materials used to construct the electronics package. For example, plastics and adhesives may contain residual solvents that evaporate at elevated temperatures. Other materials may begin (slowly) decomposing. It is not uncommon for corrosive and exotic chemical species to form. Integrated circuits may be particularly susceptible to degradation if not adequately protected.

Figure 7C:
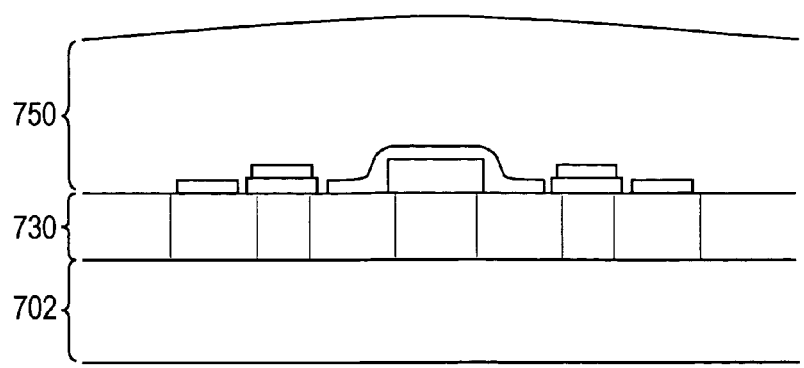
FIG. 7C shows an illustrative SOS structure with a thick passivation layer.

FIG. 7C shows one form of protection: a thick passivation layer 750 disposed over the active surface of the integrated circuit die. The passivation layer may be an oxide or nitride material. In one implementation, the passivation layer comprises about 5000 angstroms of phospohorus-doped $SiO_2$, overlaid with about 15000 angstroms of $Si_3N_4$. Thus the thick passivation layer is at least 2 microns (approximately) or more in thickness. For long term use in elevated temperature environments, it may be desirable to increase the passivation layer thickness up to about 6 microns.

Figure 8A:
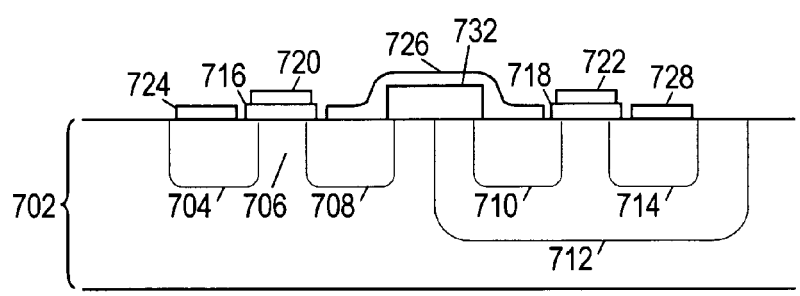
FIG. 8A shows an illustrative physical SiC structure.

FIG. 8A shows an illustrative cross-section of a complementary metal-oxide-semiconductor (CMOS) inverter constructed using a SiC technology. The inverter includes two transistors, fabricated on the surface of silicon carbide substrate 702. The first transistor includes a p-doped region 706 of silicon carbide between two $n^+$-doped regions 704, 708. The second transistor includes an n-doped region 712 between two $p^+$-doped regions 710, 714. Regions 706 and 712 are the active regions, and are each separated by corresponding insulating oxide layers 716, 718 from corresponding gate electrodes 720, 722. When a positive voltage is applied to gate 720, a channel forms in active region 706, thereby electrically coupling electrode 724 to center electrode 726. A similar voltage applied to gate 722 eliminates the channel in region 712, thereby isolating the center electrode 726 from electrode 728. Conversely, when the positive voltage is removed from gates 720 and 722, the channel in region 706 disappears, while the channel in region 712 is re-established. The center electrode 726 is thus isolated from electrode 724 and coupled to electrode 728. If electrode 724 is coupled to ground, and electrode 728 is coupled to a positive supply voltage, the voltage driven to center electrode 726 is the digital inverse of the voltage on the gate electrodes.

Note that these and other cross-sectional views of integrated circuits are not drawn to scale. Typically, the wafer substrate is about 1 mm thick, while the diffusion-doped regions may (for example) be 10–8 to 10–4 m thick. The thickness of the conducting layers may be around 10–100 nm thick, and the thickness of the insulating layers may range from a few nanometers to a few micrometers.

The large energy band gap of silicon carbide reduces leakage currents and allows for integrated circuit operation at higher temperatures than silicon. In addition, the performance may be further enhanced through the use of trenches, guard rings (i.e., conductive structures around sensitive areas) and other structures to further reduce or eliminate leakage currents. The structures are held at or near the same potential as the sensitive areas to reduce the electric field gradient, thereby reducing leakage currents). Additionally, seal rings around the perimeter of each integrated circuit die may be implemented to prevent metallic corrosion that may otherwise occur at high temperatures.

Electronics that operate at elevated temperatures may be designed to counter environmental effects (besides leakage current) caused by the elevated temperature. For example, electronics packages disposed indefinitely in an elevated temperature environment may be expected to encounter "outgassing" effects. Outgassing is an emission of chemical vapors from materials used to construct the electronics package. For example, plastics and adhesives may contain residual solvents that evaporate at elevated temperatures. Other materials may begin (slowly) decomposing. It is not uncommon for corrosive and exotic chemical species to form. Integrated circuits may be particularly susceptible to degradation if not adequately protected.

Figure 8B:
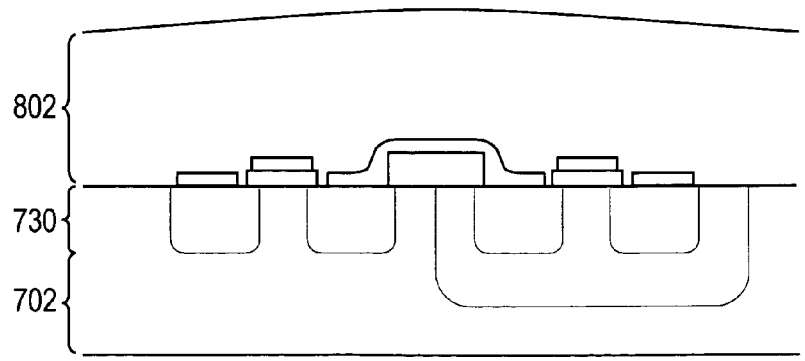
FIG. 8B shows an illustrative SiC structure with a thick passivation layer.

FIG. 8B shows one form of protection: a thick passivation layer 802 disposed over the active surface of the integrated circuit die. The passivation layer may be an oxide or nitride material. In one implementation, the passivation layer comprises about 5000 angstroms of phospohorus-doped $SiO_2$, overlaid with about 15000 angstroms of $Si_3N_4$. Thus the thick passivation layer is at least 2 microns (approximately) or more in thickness. For long term use in elevated temperature environments, it may be desirable to increase the passivation layer thickness up to about 6 microns.

Another environmental effect at elevated temperatures is enhanced electromigration. Electromigration is the movement of metal atoms caused by the flow of electrons. Electromigration can lead to the thinning and separation of interconnections within an integrated circuit. One way to protect against electromigration is to limit current densities. In conventional circuits, electromigration in metal interconnections has been observed at current densities above $10^5$ $A/cm^2$. This value can be expected to drop at higher temperatures, and may depend on the metal or alloy used to fabricate the interconnections. Nevertheless, establishing a current density limit in the range $5 \times 10^3$ $A/cm^2$ to $5 \times 10^4$ $A/cm^2$ can be expected to eliminate electromigration as a cause of performance degradation or device failure. To limit current densities, the integrated circuits may be designed to operate on lower currents (e.g., more slowly), or the interconnects may be designed with larger cross-sectional areas. For example, the interconnects may be fabricated two to five times wider and two to three times thicker than conventional interconnects to reduce current densities.

An integrated circuit designed for high-temperature operation and implemented using SiC or SOS technology may find a wide variety of applications in many environments, including downhole environments, metal foundries, petroleum refineries, process controls, automotive engines, and aerospace engines. FIG. 9 shows an example of an application of high-temperature electronics to drill-bit performance monitoring. A hole is drilled in a formation 902 by a drill bit 904 attached to a drill string (not shown here). The drill bit 904 has multiple blades 908 tipped with polycrystalline diamond compact (PDC) cutters 910. As the drill bit 904 is rotated, the cutters 910 cut away the rock with a shearing action. An interior passage 912 conducts drilling fluid to the drill bit 904, where it then flows through nozzles 914 between the blades to cool the cutters 910 and move debris upward away from the drill bit 904 along the annulus around the drill string. The operation of the drill bit involves rock cutting, high-pressure high-volume drilling fluid flow though various orifices, and often friction from rotating bearings, seals and lubricant. Each of these factors generates heat, raising the local temperature of portions of the drill bit at least several tens of degrees above the environment. When drill bits are employed in high temperature downhole environments, their performance is often difficult to monitor. Accordingly, an integrated circuit sensor 916 fabricated using SOS or SiC technology may be coupled to the back side of one of the cutters 910. An electronics telemetry package 918 may be coupled to the sensor 916 to acquire sensor data and transmit it to a receiver which may be mounted nearby. Similar techniques may be used to add sensors to roller cone drill bits.

The sensor 916 may be configured to measure temperature, strain, vibration, and/or other parameters relating to the performance of the drill bit. Additionally or alternatively, sensors may be provided to monitor parameters associated with the drilling fluid or the surrounding formation. As the drill bit becomes worn, changes in one or more of these parameters may alert the driller that it is time to replace the drill bit or slow the drilling rate. The SiC or SOS circuitry may also be used to condition the measurements by sensors made with other technologies (e.g. piezoelectric strain gauges).

Using the above described SOS or SiC transistors, fundamental electronic circuits such as inverters, analog-to-digital converters, digital-to-analog converters, oscillators, voltage references, operational amplifiers, and digital logic gates may operate at high temperatures (e.g., in excess of 200 C) for an extended period of time. These fundamental electronic circuits may be implemented to build electronic devices that permit a tool to sense, process and store tool component characteristics and environmental characteristics as described above. Some examples of electronic devices that may be implemented to sense, process and store characteristics include: anti-fuse memories, state machines, floating poly-to-poly memories, microprocessors, micro electromechanical systems (MEMS), tag sensors, DC/DC voltage converters, digital memory, analog memory, programmable logic devices (PLDs), mixers, switches, charge pumps and other devices. In addition on-chip transformers may be fabricated by placing magnetically coupled conductive loops (e.g., one current-carrying spiral overlaid on a second current-carrying spiral) on the substrate. On chip inductors may be fabricated from conductive loops or long conductor runs on the substrate. On-chip capacitors may be fabricated from metal-oxide-semiconductor transistors with large gates. Alternatively, on-chip capacitors may be fabricated from closely-spaced metal layers on the substrate. On-chip resistors may be fabricated as biased transistors with appropriate channel resistances.

FIG. 10A shows an electrical schematic of a CMOS inverter which may be implemented using an SiC technology (compare with FIG. 7). The inverter comprises two transistors 1002, 1004. Transistor 1002 is a MOS transistor with a p-type active region (PMOS), and transistor 1004 is a MOS transistor with a n-type active region (NMOS). This transistor configuration drives the digital inverse of the voltage at node A onto node B. FIG. 10B shows the electrical symbol 1006 for an inverter.

FIG. 11 shows an example of an inverter ring oscillator. The oscillator is built using an odd number of inverters 1006 in series. Applying power to the series produces an oscillating signal at node C. The inverters may be designed to be temperature sensitive, or alternatively they may be augmented with temperature sensitive components between the inverters. In such a design, the oscillation frequency is temperature sensitive, allowing the inverter ring to be used as a temperature sensor. In the drill bit context (FIG. 9), the oscillating sensor signal may be received from sensor 916 and transmitted by telemetry package 918. Alternatively, the sensor may be coupled directly to an antenna to transmit the oscillating signal without intervention. In other embodiments, the inverter ring may be designed to be sensitive to a parameter other than temperature.

Inverter ring sensors may be simple and robust. However, they may be unsuitable as high-precision sensors. For high-precision sensing, digital data acquisition and processing may be preferred. The ingredients of a digital data acquisition circuit typically include a voltage reference, a sample and hold circuit, and an analog-to-digital converter (ADC). A charge-coupled delay line and a digital memory may also be used. In the following discussion, examples are provided of various constructions of selected components.

Figure 12:
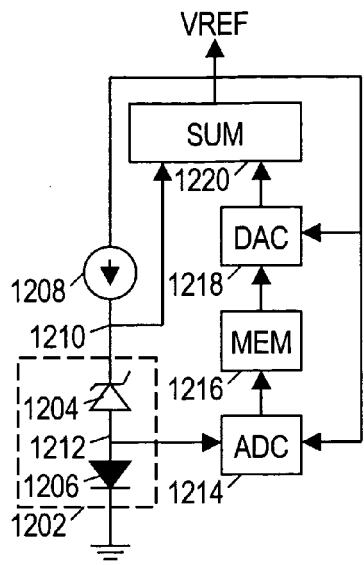
FIG. 12 shows an illustrative high-precision temperature compensated voltage reference.

FIG. 12 shows a high-accuracy temperature-compensated voltage reference suitable for use at elevated temperatures. The voltage reference may be suitable for use by geothermal tools, smart transducer interface node telemetry (STINT) systems, wireline logging tools, MWD tools, and any tools used in a high temperature environment that employ analog-to-digital conversion (e.g., downhole tools). The voltage reference includes a first order voltage reference source 1202 such as a bandgap circuit or a temperature compensated Zener diode. Both of the examples given include temperature-compensation components with a positive temperature coefficient to compensate a negative temperature coefficient elsewhere in the first order reference source. Tapping this component allows for determination of a temperature-indicative voltage.

The first order voltage reference source 1202 in FIG. 12 is a temperature compensated Zener diode source, having a Zener diode 1204 in series with a forward-biased diode 1206. (The voltage across the diode serves here as the temperature-indicative voltage.) A current source 1208, when applied to the first order source 1202, generates a first-order voltage reference at node 1210. An analog-to-digital converter (ADC) 1214 samples the temperature indicative voltage from node 1212 and digitizes the value with (e.g.) 16 bits of resolution. The digital value is supplied as an address to a nonvolatile memory 1216. The memory 1216 is filled with compensation values determined during a calibration process at product deployment. The compensation value for the measured temperature-indicative voltage is supplied to a digital-to-analog converter (DAC) 1218 which generates an analog compensation voltage. (Again, 16 bits of precision may be preferred.) A summation circuit 1220 generates the high-precision voltage reference from the first-order voltage reference and the compensation voltage. The high-precision reference voltage may be used to drive the current source 1208, and may serve as a reference for the ADC 1214 and DAC 1218.

Figure 13:
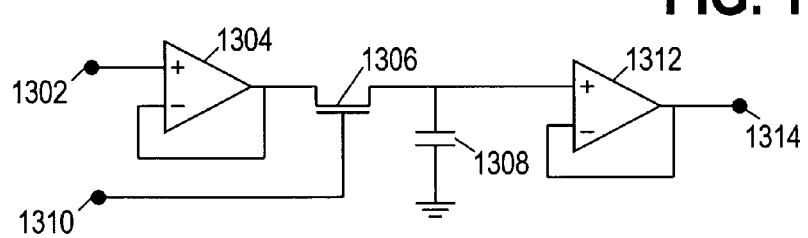
FIG. 13 shows an illustrative sample and hold circuit.

FIG. 13 shows an example of a sample and hold circuit. When implemented using SiC technology, the performance of the sample and hold circuit is expected to be significantly better than the performance of comparable silicon circuits due to the inherently low leakage currents present in SiC circuits.

An input signal voltage at node 1302 is buffered by an operational amplifier 1304. A gate signal supplied to node 1310 switches a gate transistor 1306 between "open" and "closed" states. When the gate transistor 1306 is in a conductive state, the operational amplifier 1304 drives the buffered voltage onto capacitor 1308. When the gate transistor is nonconductive, the capacitor voltage 1308 is frozen, i.e., the sampled input voltage is "held". Capacitor 1308 may be an on-chip capacitor, or for extended hold applications, capacitor 1308 may be an on-chip capacitor connected in parallel with an off-chip capacitor. Another operational amplifier 1312 buffers the capacitor voltage, supplying an output signal node 1314 with a voltage indicative of the capacitor voltage.

Figure 14A:
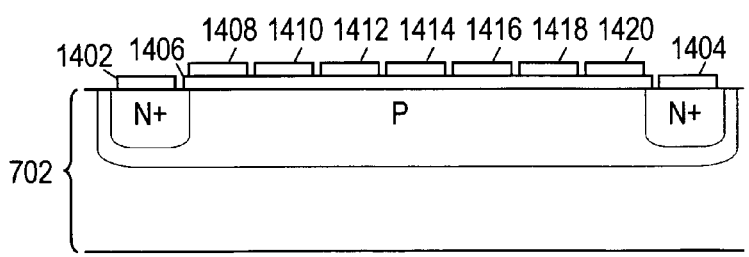
FIGS. 14A and 14B show illustrative charge coupled delay lines.

FIG. 14A shows a charge coupled delay line implemented using SiC technology. A SiC wafer 702 is provided with a device structure having terminal regions of N+ doped silicon carbide around an active region of p-doped silicon carbide. A "loading" electrode 1402 is coupled to one terminal region, and an "unloading" electrode 1404 is coupled to the other terminal region. Between the terminal regions is a series of gates 140–1420 separated from the active region by a gate insulator 1406. When driven in the appropriate sequence, a charge (indicative of the current supplied to the loading electrode) is passed from gate to gate and eventually delivered to the unloading electrode, where the charge can be measured. The driving sequence can be controlled to generate programmable delays. An illustrative driving sequence is shown in the following table, in which "B" represents a buffer voltage (e.g., 5 volts) at which the charge held underneath a gate is negligible, "H" represents a hold voltage (e.g., 10 volts) at which charge is stored underneath a gate, and "P" represents a pass voltage (e.g., 15 volts) at which charge is pulled from underneath adjacent gates.

| Time | gate 1408 | gate 1410 | gate 1412 | gate 1414 | gate 1416 | gate 1418 | gate 1420 |
| --- | --- | --- | --- | --- | --- | --- | --- |
| 1 | H | P | B | H | P | B | B |
| 2 | B | P | B | B | P | B | B |
| 3 | B | H | B | B | H | B | B |
| 4 | B | H | P | B | H | P | B |
| 5 | B | B | P | B | B | P | B |
| 6 | B | B | H | B | B | H | B |
| 7 | B | B | H | P | B | H | H |
| 8 | B | B | B | P | B | B | H |
| 9 | B | B | B | H | B | B | B |
| 1 (rpts) | H | P | B | H | P | B | B |

Each gate (except the ones adjacent to the terminal regions) goes through a nine-step sequence of voltages to draw charge from a preceding gate, hold the charge momentarily, pass the charge on to the next gate, and act as a buffer while the preceding gate gathers a charge. The gates adjacent the terminals may operate as valves, never drawing a charge, but simply allowing the charge to pass to (or from) the terminal electrodes.

The charge coupled delay line can operate at very high frequencies, e.g. the control sequence may be clocked at radio frequencies without significantly impairing performance. At the other extreme, the charge coupled delay can operate at very low frequencies. The control sequence may even be halted indefinitely at steps 3, 6 or 9 to store charge in the delay line. This configuration allows the delay line to be used as a low-complexity analog memory. Thus, for example, a low complexity sensor may include a transducer, a simple amplifier, and a suitably clocked delay line which stores a sequence of measurements made by the transducer. The sensor may then be physically transported to a central installation where the measurements are recovered, converted to digital values, and subjected to customary digital signal processing thereafter.

Figure 14B:
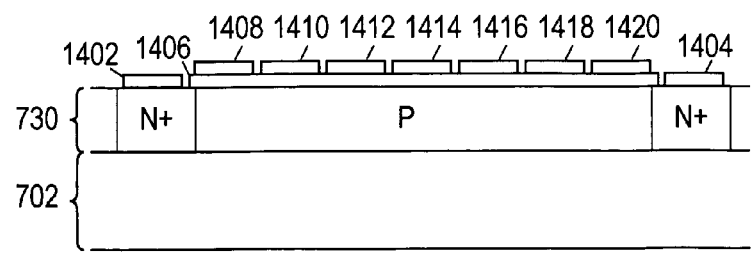

FIG. 14B shows a charge coupled delay line implemented using SOS technology. A sapphire wafer 702 is provided with a semiconducting layer 730 having terminal regions of N+ doped silicon around an active region of p-doped silicon. A "loading" electrode 1402 is coupled to one terminal region, and an "unloading" electrode 1404 is coupled to the other terminal region. Between the terminal regions is a series of gates 140–1420 separated from the active region by a gate insulator 1406. The operation of the charge coupled delay line of FIG. 14B is the same as, or is similar to, the operation of the charge coupled delay line described above for FIG. 14A.

SiC and SOS technology offers a performance advantage at high temperatures. However, as a new technology, SiC and SOS dies may suffer from relatively high numbers of fabrication defects. In other words, the defect densities may be high enough to make fabricating large, complex integrated circuits infeasible. The yield rate (the fraction of fabricated devices that function properly) is strongly dependent on the size of the integrated circuit die. Large die size virtually guarantees the presence of a defect on each die, drastically reducing the yield rate. Existing SiC and SOS fabrication techniques may provide "acceptable" yield rates if the die size is strictly limited. Given such yield rate restrictions, complex circuits such as high-performance processors and computers may only be feasible as partitioned designs, i.e., designs partitioned so that each piece can fit on a die of a predetermined size and so that the overall design can be constructed by piecing together functional die into a hybrid circuit (such as a multi-chip module).

FIG. 15 shows an illustrative partitioning to allow use of a fabrication technology to produce a complex electronics package 1702 suitable for use in a high temperature environment. The package 1702 may include a processor 1704 that is partitioned into a fetch module 1706 for retrieving instructions and data from memory, as well as data from registers, a register module 1708 for storing intermediate calculation values, an execution module 1710 for processing data in accordance with instructions, and a commit module 1712 for storing results from the execution module in registers and memory. Each module may be on a separate die and coupled together to form processor 1704. The package 1702 may further include a cache module 1714 for caching data and instructions requested by the processor, a bus interface module 1716 for coupling the cache and processor to other system components, a memory module 1718 for storing software and data, a network interface module 1720 for coupling the package to external computer components, a data acquisition module 1722 for controlling transducers and acquiring sensor data, a driver module 1724 for powering actuators and transducers, a sensor module 1726 for amplifying and detecting signals from sensors, and a micro electromechanical system (MEMS) module 1728 for internal sensing of various parameters. Each module may be on a separate die and coupled together to form the electronics package 1702.

FIG. 16 shows a multi-chip module 602 which may be used to implement a partitioned design. Each die 1802, 1804, 1806, may have a partitioned portion of the overall design, and may be tested prior to construction of the multi-chip module 602. The overall cost of the design may be greatly reduced due to the enhanced yield rates of each die.

Micro electromechanical systems (MEMS) technology may be implemented using SiC or SOS technology. FIGS. 17A and 17B show an example of a cantilever which may be used as an acceleration or vibration sensor. The surface of the sapphire or SiC wafer 702 may be patterned and chemically etched to create a cantilever 1902 having a top electrode 1904. FIG. 17A shows a side view, while FIG. 17B shows an "end-on" view of the cantilever structure. In FIG. 17B, the side-wall electrodes 1906 are shown. When the device is subjected to acceleration or some source of deformation, the cantilever 1902 deflects slightly. The deflection may be detected as a change in capacitance between the top electrode 1904 and the side electrodes 1906. Alternatively, the deflection may be detected using a piezoresistive or piezoelectric material on the cantilever or at the base where the cantilever joins. The cantilever's deflection induces a resistance change in the piezoresistive material (e.g., n-doped or p-doped silicon), or induces a voltage drop across the piezoelectric material (e.g., zinc oxide or $PbZrTiO_3$). In yet another implementation, deflection may be measured by changes in a light beam reflected from the cantilever.

Though a cantilever structure has been illustrated, numerous variations exist, some of which are particularly suitable for different measurements. In one variation, the cantilever is enlarged at its free end to increase the cantilever mass. In another variation, the cantilever is fixed at both ends to form a bridge. In yet another variation, multiple supports suspend a central object such as a mass or reflective surface. In still another variation, the "bridge" is supported on all sides to form a flexible membrane. In each of these variations, motion of the structure's central part can be detected and measured using changes in capacitance, piezoresistance, magnetoresistance, induced voltage, optical phase/direction, resonance, or potentially even inductance. The motion of the central part can be indicative of strain, force, acceleration, pressure, resonant frequency, temperature, orientation and many other physical parameters.

In addition to sensing, MEMS structures can be used as actuators, converting an electrical signal into displacement, deflection and/or rotation. Electrostatic, piezoelectric, magnetic, hydraulic, and thermal forces can be used to cause motion in MEMS structures. Various construction techniques and sensor structures are described for bulk silicon in Julian W. Gardner, et al., *Microsensors, MEMS and Smart Devices*, © 2001 Wiley & Sons, which is hereby incorporated by reference. Refer also to Danny Banks's Introduction to Microengineering, (www.dbanks.demon.co.uk) © 1999 Danny Banks, which is hereby incorporated by reference. In addition to accelerometers, MEMS techniques may be applied to fabricate pressure sensors, gyros, temperature sensors, thermal arrays, etc. The sensor configuration may be based on (among other examples): rotational motion detection, torsional force detection, lateral or vertical cantilever configurations, and capacitive, inductive, resistive, and optical transducers.

Figure 18:
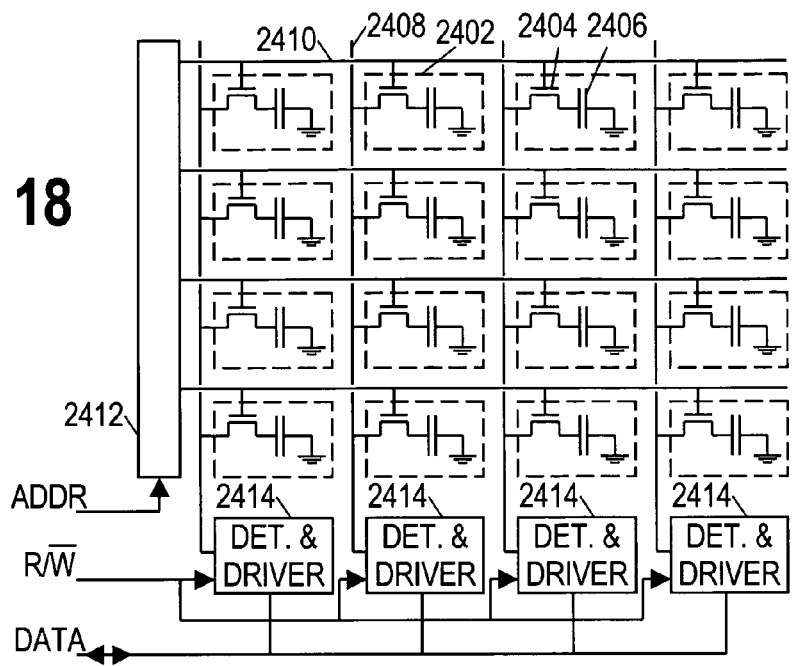
FIG. 18 shows an illustrative analog memory.

Since SiC and SOS technology allows for the creation of devices with minimal leakage currents, SiC and SOS technology may serve as a basis for analog memories. The reduced leakage will allow for extended storage of charge with only minimal degradation due to leakage currents. FIG. 18 shows an illustrative analog memory that includes an array of memory cells 2402. Each memory cell includes an access transistor 2404 and a capacitor 2406. When a row line 2410 is asserted, the access transistors coupled to the asserted row line will couple the capacitor to a corresponding column line 2408. During a storage operation, the column lines charge the capacitor to store an analog value. During a read operation, the capacitor charge is shared with the column line, altering the potential of the column line in a measurable way.

The analog memory receives a digital address signal, a digital read/write signal, and one or more bidirectional analog data signals. A row decoder 2412 asserts the row line indicated by the address signal. One or more detector and driver circuits 2414 receives the read/write signal. When the control signal indicates a read operation, the detector and driver circuits perform a sensing operation on the column lines to measure the charge stored in the analog memory cells made accessible by the assertion of a row line. The analog values are amplified and driven as an output signal on the analog data lines. Thereafter, the detector and driver circuits may recharge the memory cell to the measured values. When the control signal indicates a write operation, the detector and driver circuits buffer the analog data signal values from the analog data bus, and charge the capacitors in the accessible memory cells to the corresponding values.

Although the leakage currents are small, they will not be completely eliminated. Accordingly, some decay of the stored analog values may be expected over time. If the decay rate is sufficiently long, the decay may be measured through the use of reference cells in the analog memory array. One or more selected cells may be used to store predetermined analog values at the same time the rest of the memory array is filled. Thereafter, when the memory is read, the reference cells may be used to measure the decay rates, and the other stored analog values may be compensated accordingly.

If the decay rate is somewhat larger, then each analog memory cell may be periodically refreshed. During a refresh operation, the stored analog value is read, amplified to compensate for an assumed decay rate, and stored back into the memory cell. Reference memory cells may be employed to measure the overall change caused by repeated decay and refresh cycles, so that when the data is finally read, some compensation may be made for accumulated inaccuracies in the refresh operations.

Figure 19:
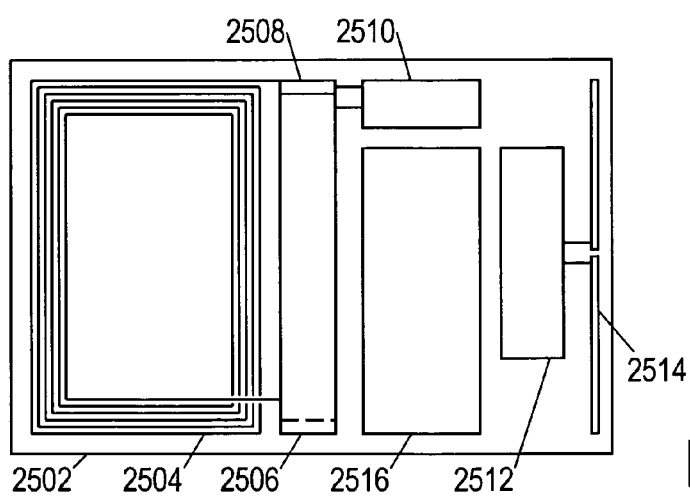
FIG. 19 shows an illustrative tag device.

FIG. 19 shows a wireless RF tag device 2502 implemented using SiC or SOS technology. When implemented using SiC or SOS technology, such a device may operate in high-temperature environments. The illustrated tag device 2502 includes an inductive coil 2504 coupled between the two plates 2506 and 2508 of a capacitor. The inductive coil 2504 is configured to resonate with the capacitor in response to a high-frequency electromagnetic signal. A power circuit 2510 captures power from the resonance and provides power to the other device components. The tag device further includes a transceiver module 2512 and a printed dipole antenna 2514. The transceiver module 2512 is configured to detect commands that may be transmitted to the tag device 2502, and is further configured to respond by transmitting on the dipole 2514.

The tag device may further include a nonvolatile memory module 2516 for storing data. The transceiver 2512 may store received data in response to a detected command. The transceiver may transmit stored data in response to another detected command.

The tag device 2502 may be implemented as a small die measuring (e.g.) less than 5 mm on each side. Rather than being packaged, the tag device may be coated with a thick passivation layer and possible provided with a wide seal area between the passivation layer and the die, surrounding the active portion of the integrated circuit. When constructed in this manner, each tag device may cost very little. The tag device may be able to survive and operate at extreme pressures and elevated temperatures. Accordingly, tag devices may be added to a fluid flow (e.g., a flow of drilling fluid into a well) as information carriers. As the tag devices pass sensor stations, the tag devices may be activated to receive and store sensor data. Later, as the fluid flow passes a data acquisition center, the tag devices may be activated to transmit their stored data. Each device may be configured to transmit on a different frequency or with a different modulation code, so that multiple devices may be interrogated simultaneously. The tag devices may communicate with the sensor and data acquisition stations using an ultra-wide band (UWB) wireless protocol using frequencies in the 3–10.6 GHz range.

In addition to performing a telemetry transport function, the tag devices may be used as a tracing mechanism to detect fluid flow paths and fluid loss. In the well context, the tag devices may be swept by the fluid as the fluid flows from the well into the formation. A wireline probe passing along the well bore may detect concentrations of tag devices at these fluid loss regions, and indeed, the probe may be able to map faults from the spatial distribution of the tag devices.

In an alternate embodiment, the tag device may include sensors rather than memory. When interrogated, the tag device may transmit its own sensor measurements. Such an embodiment may be useful for locating sensors in locations where wires are not feasible. For example, slip rings on rotating components and wire junctions in hostile environments are primary failure points which could be eliminated with a tag device. Of course wireless communication may be built into other SiC or SOS devices.

Fabrication of memories and other integrated circuits on the surface of SiC and SOS wafers involves a number of steps to deposit and pattern each of a number of material layers that together form the integrated circuit. Patterning of materials may be performed by photolithography. Photolithography involves spinning a light-sensitive photoresist material onto the wafer surface. Next, using precise optical processes, the photoresist material is patterned in the shape of individual circuit components by shining light onto the layer through a pattern on a glass mask, or reticle. The exposed photoresist material is cured and developed, then dissolved areas of the photoresist are rinsed away, leaving the wafer ready for patterned etching or implant doping. The aforementioned processes are generally repeated as each subsequent layer is fabricated.

Typically, the fabrication process begins with the fabrication of individual circuit elements on the wafer surface. Electrical connections between appropriate circuit elements, and electrical isolation between other circuit elements, are then established using alternating layers of appropriately patterned conductors and insulators. The circuit elements and their interconnections are formed using a series of processing steps including ion implantation, thin film deposition, photolithography, selective etching, as well as various cleaning processes.

Increasingly complex integrated circuits utilize an increasing number of circuit elements, which in turn leads to more electrical conduction paths between circuit elements and a greater number of conductor-insulator layers to achieve these paths. The increasing number of layers makes successive layer-to-layer alignment, or registration, more difficult. This issue may be addressed through the use of chemical-mechanical polishing (CMP) processes to re-planarize the surface of the wafer after one or more layers have been fabricated.

The CMP operation generally serves to remove excess coating material, reduce wafer topographical imperfections, and improve the depth-of-focus for photolithography processes through better planarity. The CMP process involves the controlled removal of material on the wafer surface through the combined chemical and mechanical action on the semiconductor wafer of a slurry of abrasive particles and a polishing pad. During the CMP operation, sub-micron-size particles from the associated polishing slurry are used to remove non-planar topographical features and extra coating on the wafer surface.

Figure 20:
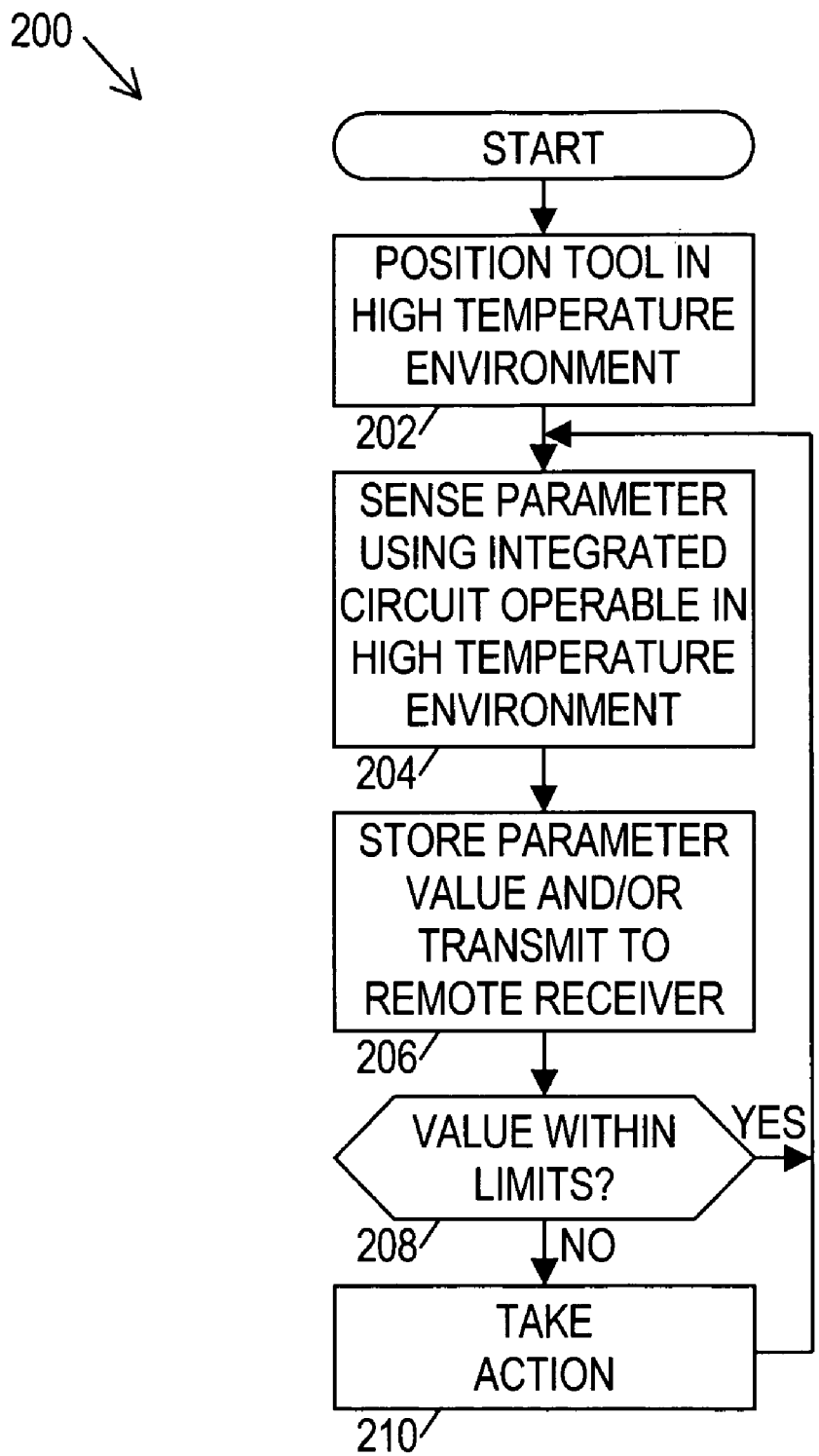
FIG. 20 shows a method in accordance with embodiments of the invention.

FIG. 20 illustrates a tool operation method 200. As shown in FIG. 20, the method 200 may comprise positioning a tool in a high temperature environment (e.g., about 200 Celsius or above) at block 202. A parameter may then be sensed using an integrated circuit that is operable in the high temperature environment (block 204). In at least some embodiments, the parameter may be indicative of tool performance in a downhole environment. For example, the parameter may be acceleration, pressure, rotation, vibration and temperature of the tool or a tool component. Alternatively, the parameter may measure an environmental parameter of interest, such as density, viscosity, porosity, resistivity, or other such parameters of the surrounding fluid or formation.

In block 206, the tool stores the sensed parameter value and/or transmits the sensed parameter value to a telemetry receiver. In block 208, the tool determines whether the parameter value is within a given range. If the parameter value is within the given range, no action is taken, and control returns to block 204. Otherwise, in block 210, an action is performed. Depending on the particular tool, the action may be opening or closing a valve, adjusting the position of an actuator, or halting operations to remove the tool from the environment. For example, if the parameter values indicate the functionality of the tool is below a threshold value (at block 208), the tool is preferably removed from the high temperature environment (block 210). In some embodiments, the parameter values may be sensed, stored, and/or transmitted using integrated circuits formed on a silicon carbide substrate or a sapphire substrate. Additionally, the parameter values may be transmitted to a remote tool operator interface as previously described.

Numerous variations and modifications will become apparent to those skilled in the art once the above disclosure is fully appreciated. For example, the disclosed invention embodiments may be applied in elevated temperature environments unrelated to wells. For example, the disclosed embodiments may be employed for internal combustion engine monitoring, aerospace engine control, heat-driven power generation, materials processing, and oven controls. In addition, the teachings herein regarding silicon on sapphire technology are also applicable to silicon on spinel technology, simply by replacing the sapphire substrate with a spinel substrate. It is intended that the following claims be interpreted to embrace all such variations and modifications.

What is claimed is:

1. A tool, comprising:
a tool body; and
tool electronics located within the tool body,
wherein the tool electronics comprise an integrated circuit formed on a substrate from a group consisting of silicon carbide substrates and sapphire substrates,
wherein the integrated circuit is selected from the set consisting of analog-to-digital converters, digital-to-analog converters, operational amplifiers, digital logic gates, voltage references, oscillators, anti-fuse memories, state machines, floating poly-to-poly memories, microprocessors, micro electromechanical systems (MEMS), tag sensors, DC/DC voltage converters, digital memory, analog memory, processors, on-chip transformers, on-chip inductors, on-chip capacitors, on-chip resistors, programmable logic devices (PLDs), mixers, switches, and charge pumps.

2. The tool of claim 1, wherein the tool electronics are configured to sense at least one tool component characteristic.

3. The tool of claim 1, wherein the tool electronics are configured to sense a characteristic of the tool environment.

4. The tool of claim 3, wherein the tool is a logging while drilling tool.

5. The tool of claim 3, wherein the tool is a wireline logging tool.

6. The tool of claim 3, wherein the tool is downhole, long-term well monitoring tool.

7. The tool of claim 3, wherein the tool is configured to transmit the sensed characteristic to a tool operator interface that is remotely located with respect to a location of the tool.

8. The tool of claim 1 wherein the integrated circuit is designed to maintain current densities in metal interconnects below about $10^4$ A/cm$^2$.

9. The tool of claim 1, further comprising:
a rotating base; and
cutters mounted in the rotating base.

10. The tool of claim 9 wherein the substrate is mounted near at least one of the cutters, wherein the integrated circuit is configured to detect at least one characteristic in a group consisting of tool component characteristics and environmental characteristics, and wherein the integrated circuit is operable at temperatures in excess of 200 Celsius.

11. The tool of claim 1 wherein the tool electronics comprise:
a hybrid circuit that having multiple silicon on sapphire (SOS) dies, with each die being limited to a size limit calculated to optimize cost of the hybrid circuit,
wherein each die carries an integrated circuit that is a partitioned portion of a larger integrated circuit, and
wherein the hybrid circuit is operable when in temperature environments of at least 200 Celsius.

12. The tool of claim 1 wherein the tool electronics comprise a micro electromechanical system (MEMS) structure on the substrate.

13. The tool of claim 12 wherein the MEMS is configured to operate as a sensor selected from a group consisting of accelerometers, pressure sensors, gyros, temperature sensors, and thermal arrays.

14. The tool of claim 1 wherein the tool electronics comprise:
multiple integrated circuits disposed within a multi-chip module; and
a Peltier cooler disposed within the multi-chip module and configured to intermittently cool at least one of the multiple integrated circuits.

15. A tool, comprising:
a tool body;
tool electronics located within the tool body, wherein the tool electronics are operable to sense at least one characteristic from a group consisting of tool component characteristics and environmental characteristics, and are further operable to transmit the sensed characteristic to a tool operator interface remotely located with respect to a location of the tool,
wherein at least some of the tool electronics are operable when exposed to temperatures of at least 200 Celsius,
wherein the integrated circuit is selected from the set of circuits consisting of analog-to-digital converters, digital-to-analog converters, operational amplifiers, digital logic gates, voltage references, oscillators, anti-fuse memories, state machines, floating poly-to-poly memories, microprocessors, micro electromechanical systems (MEMS), tag sensors, DC/DC voltage converters, digital memory, analog memory, processors, on-chip transformers, on-chip inductors, on-chip capacitors, on-chip resistors, programmable logic devices (PLDs), mixers, switches, and charge pumps.

16. The tool of claim 15 wherein the tool electronics comprise an integrated circuit formed on at least one of a silicon carbide substrate and a sapphire substrate.

17. The tool of claim 16 wherein the integrated circuit employs a seal ring that prevents metallic corrosion.

18. The tool of claim 16 wherein the integrated circuit is designed to maintain current densities in metal interconnects below a predetermined limit.

19. The tool of claim 18, wherein the predetermined limit is between $5 \times 10^3$ and $5 \times 10^4$ A/cm$^2$.

20. The tool of claim 16 wherein the integrated circuit is covered by a passivation layer thicker than about 2 microns.

21. The tool of claim 16 wherein the integrated circuit is configured to operate at a clock frequency in excess of about 100 MHz.

22. The tool of claim 16 further comprising:
a rotating base; and
cutters mounted in the rotating base.

23. The tool of claim 22 wherein the tool electronics comprise an electronic device mounted near at least one of the cutters and configured to detect said characteristic, wherein the electronic device is operable when exposed to temperatures of at least 200 Celsius.

24. The tool of claim 15 wherein the tool electronics comprise:
a hybrid circuit that includes multiple silicon on sapphire (SOS) dies, with each die being limited to a size limit calculated to optimize cost of the hybrid circuit,
wherein each die carries an integrated circuit that is a partitioned portion of a larger integrated circuit, and
wherein the hybrid circuit is operable when exposed to temperatures of at least 200 Celsius.

25. The tool of claim 15 wherein the tool electronics comprise:
multiple integrated circuits disposed within a multi-chip module; and
a Peltier cooler disposed within the multi-chip module and configured to intermittently cool a subset of the multiple integrated circuits.

26. A method, comprising:
positioning a tool in a high temperature environment having a temperature greater than 185 Celsius;
sensing a parameter value using an integrated circuit formed on a substrate from the group consisting of silicon carbide substrates and sapphire substrates; and
removing the tool from the high temperature environment if the parameter value indicates that performance of the tool is below a threshold value.

27. The method of claim 26, wherein the parameter is indicative of tool performance.

28. The method of claim 26, further comprising maintaining the tool in the high temperature environment for at least one week.

29. The method of claim 26 further comprising storing the parameter values using an integrated circuit formed on the substrate.

30. The method of claim 26 further comprising transmitting the parameter values to a tool operator interface positioned in a remote location with respect to the tool.

31. The method of claim 26 wherein the parameter is selected from a group of parameters consisting of: acceleration, pressure, rotation, vibration and temperature.

32. The method of claim 26, wherein the parameter is indicative of a property of a fluid in contact with the tool.

33. The method of claim 26, wherein the parameter is indicative of a property of a formation penetrated by the tool.

34. A micro electromechanical system (MEMS), comprising:
a deformable element; and
a support circuit coupled to the deformable element,
wherein the deformable element component and the support circuit are formed on a substrate from a group consisting of silicon carbide substrates and sapphire substrates.

35. The MEMS of claim 34, wherein the MEMS is operable when exposed to temperatures of at least 200 Celsius.

36. The MEMS of claim 34 further comprising a thick passivation layer that covers the support circuit.

37. The MEMS of claim 36, wherein the passivation layer has a thickness greater than 2 microns.

38. The MEMS of claim 34 wherein the MEMS is configured, at least in part, to operate as a sensor selected from the group consisting of accelerometers, pressure sensors, gyros, temperature sensors, and thermal arrays.

39. The MEMS of claim 34 wherein the MEMS is attached to a drill bit that is configured to operate in a drill well in temperatures of at least 200 Celsius.

40. The MEMS of claim 34, wherein the substrate is a sapphire substrate.

41. The MEMS of claim 34, wherein the substrate is a silicon carbide substrate.

42. The MEMS of claim 34, wherein the deformable element is fabricated from the substrate material.

43. The MEMS of claim 34, further comprising electrodes having a capacitance that varies when the deformable element deforms.

44. The MEMS of claim 34, further comprising a piezoresistive or piezoelectric element to detect changes in the deformable element.

45. The MEMS of claim 34, wherein the support circuit determines acceleration from deformation of the deformable element.

46. The MEMS of claim 34, wherein the support circuit determines pressure from deformation of the deformable element.

47. The MEMS of claim 34, wherein the support circuit determines orientation from deformation of the deformable element.

* * * * *